(12) United States Patent
Zeng et al.

(10) Patent No.: US 12,422,964 B2
(45) Date of Patent: Sep. 23, 2025

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yang Zeng, Beijing (CN); Yuanqi Zhang, Beijing (CN); Ping Wen, Beijing (CN); Yi Zhang, Beijing (CN); Wei Wang, Beijing (CN); Yu Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/802,217

(22) Filed: Aug. 13, 2024

(65) Prior Publication Data
US 2024/0402859 A1 Dec. 5, 2024

Related U.S. Application Data

(63) Continuation of application No. 18/039,020, filed as application No. PCT/CN2021/077248 on Feb. 22, 2021, now Pat. No. 12,124,661.

(51) Int. Cl.
*G06F 3/044* (2006.01)
*G06F 3/041* (2006.01)

(52) U.S. Cl.
CPC .......... *G06F 3/0446* (2019.05); *G06F 3/0412* (2013.01); *G06F 3/04164* (2019.05);
(Continued)

(58) Field of Classification Search
CPC .. G06F 3/0446; G06F 3/0412; G06F 3/04164; G06F 2203/04107; G06F 2203/04111; G06F 2203/04112; G09G 2300/0426; G09G 2354/00; G09G 3/32; G09G 3/3208; H10K 59/131; H10K 59/40
See application file for complete search history.

(56) References Cited

U.S. PATENT DOCUMENTS

| | | | |
|---|---|---|---|
| 2014/0368755 A1* | 12/2014 | Chen | G06F 3/0448 349/12 |
| 2016/0018348 A1* | 1/2016 | Yau | G06F 3/0443 324/697 |
| 2019/0311904 A1* | 10/2019 | Hao | G02F 1/13439 |

FOREIGN PATENT DOCUMENTS

CN 210224021 U * 3/2020

* cited by examiner

*Primary Examiner* — Brent D Castiaux
(74) *Attorney, Agent, or Firm* — ArentFox Schiff LLP; Michael Fainberg

(57) ABSTRACT

A display substrate includes a base substrate, touch electrodes, and signal lines. At least some of the signal lines are electrically connected to the touch electrodes. The signal line includes a first signal line and a second signal line adjacent to each other. The first signal line and the second signal line respectively comprise a first-layer wiring and/or a second-layer wiring overlapped with each other in a direction perpendicular to the base substrate and electrically connected to each other. A line width of the first signal line is greater than a line width of the second signal line. The first-layer wiring of at least one of the first signal line or the second signal line is disconnected, and the second-layer wiring of the first signal line is continuous in a disconnected position.

20 Claims, 17 Drawing Sheets

(52) U.S. Cl.
CPC .............. *G06F 2203/04107* (2013.01); *G06F 2203/04111* (2013.01)

DISPLAY SUBSTRATE AND DISPLAY DEVICE

CROSS-REFERENCE TO RELATED APPLICATIONS

This application is a continuation of U.S. application Ser. No. 18/039,020, which is a National Stage of International Application No. PCT/CN2021/077248, filed Feb. 22, 2021, the entire content of which is hereby incorporated by reference.

TECHNICAL FIELD

The disclosure relates to the technical field of display, and particularly to a display substrate and a display device.

BACKGROUND

The Organic Light-Emitting Diode (OLED) display device is a display screen based on an organic electroluminescent diode, has excellent characteristics such as self-illumination, high contrast, thin thickness, wide viewing angle, fast response speed, usability for flexural panels, wide operating temperature range, simple structure and manufacturing process, etc., has received more and more attention, and has a broad application prospect. In the related art, the touch function is integrated by embedding a touch module in an OLED display module, so as to realize the integration of display function and touch function of the OLED display device.

SUMMARY

Embodiments of the disclosure provide a display substrate and a display device. The solution is as follows.

In one aspect, embodiments of the disclosure provide a display substrate, including:
a base substrate including a display area and a frame area around the display area;
a plurality of touch electrodes in the display area; and
a plurality of signal lines in the frame area.

At least some of the signal lines are electrically connected to the plurality of touch electrodes. The signal lines include a first signal line and a second signal line adjacent to each other. The first signal line and the second signal line respectively include a first-layer wiring and/or a second-layer wiring overlapping with each other in a direction perpendicular to the base substrate and electrically connected to each other. A line width of the first signal line is greater than a line width of the second signal line. A ratio of the line width of the first signal line to the line width of the second signal line is greater than 1. The first-layer wiring of at least one of the first signal line or the second signal line is disconnected, and the second-layer wiring of the first signal line is continuous in a disconnected position.

Optionally, in the above display substrate according to the embodiments of the disclosure, the first-layer wiring of the second signal line is disconnected, and the first-layer wiring of the first signal line is continuous in a disconnected position.

Optionally, the above display substrate according to the embodiments of the disclosure further includes: a bridge layer between the base substrate and a layer where the plurality of touch electrodes are located, and an insulating layer between the bridge layer and the layer where the plurality of touch electrodes are located.

The first-layer wiring of the signal lines is arranged in a same layer as the plurality of touch electrodes, and the second-layer wiring is arranged in a same layer as the bridge layer.

Optionally, in the above display substrate according to the embodiments of the disclosure, the signal lines include a plurality of touch signal lines and at least one first shielding line. The plurality of touch signal lines are electrically connected to the plurality of touch electrodes, and the at least one first shielding line is floating, loaded with a fixed potential or loaded with a same signal as the touch signal lines.

The second signal line is the touch signal line, and the first signal line is the first shielding line.

Optionally, in the above display substrate according to the embodiments of the disclosure, a position where the touch signal line is electrically connected to the corresponding touch electrode is an intersection point. A position where the touch signal line is disconnected is a fracture. A minimum distance between a center point of the fracture and the intersection point is less than or equal to 100 μm.

Optionally, in the above display substrate according to the embodiments of the disclosure, the intersection point and the fracture are located on the same touch signal line.

Optionally, in the above display substrate according to the embodiments of the disclosure, the fracture is located between the intersection point and an end of the first shielding line close to the intersection point.

Optionally, in the above display substrate according to the embodiments of the disclosure, there are a plurality of intersection points, and the fracture is located between the plurality of adjacent intersection points.

Optionally, in the above display substrate according to the embodiments of the disclosure, via holes penetrating the insulating layer are respectively arranged on both sides of the fracture, and the corresponding first-layer wiring and second-layer wiring are electrically connected through the via holes.

Optionally, in the above display substrate according to the embodiments of the disclosure, a distance between a position of the via hole and the fracture is approximately 2 μm to 20 μm.

Optionally, in the above display substrate according to the embodiments of the disclosure, a length of the via hole is greater than a length of the fracture in an extending direction of the signal line.

Optionally, in the above display substrate according to the embodiments of the disclosure, a ratio of the length of the via hole to the length of the fracture is greater than 1.25.

Optionally, in the above display substrate according to the embodiments of the disclosure, a ratio of a length of the fracture in an extending direction of the signal line to a width of the fracture in a direction perpendicular to the extending direction of the signal line is less than 1.

Optionally, in the above display substrate according to the embodiments of the disclosure, the plurality of touch electrodes include: a plurality of first touch electrodes extending in a first direction.

The plurality of touch signal lines include a plurality of first touch signal lines and a plurality of second touch signal lines. The plurality of first touch signal lines and the plurality of second touch signal lines are electrically connected to the plurality of first touch electrodes respectively.

The frame area includes: a first frame area, a second frame area, a third frame area and a fourth frame area. The first frame area and the second frame area are respectively located on two ends of an extending direction of the first touch electrodes, and the third frame area and the fourth frame area are respectively located on two sides of the extending direction of the first touch electrodes.

The plurality of first touch signal lines extend from the first frame area through the third frame area to the second frame area. The plurality of second touch signal lines are located in the second frame area.

The at least one first shielding line is located between the plurality of first touch signal lines and the display area. The first shielding line is arranged around the plurality of first touch signal lines. At least one of the at least one first shielding line, the first touch signal line with a smallest distance from the first shielding line, or the second touch signal line with a smallest distance from the first shielding line is disconnected in the layer where the plurality of touch electrodes are located, and each of the signal lines in the bridge layer is continuous.

Optionally, in the above display substrate according to the embodiments of the disclosure, the first touch signal line with the smallest distance from the at least one first shielding line is disconnected in the layer where the plurality of touch electrodes are located.

Optionally, in the above display substrate according to the embodiments of the disclosure, the second touch signal line with the smallest distance from the at least one first shielding line is disconnected in the layer where the plurality of touch electrodes are located.

Optionally, in the above display substrate according to the embodiments of the disclosure, each of the second touch signal lines includes a plurality of first parts and a plurality of second parts. An extending direction of the first part intersects with an extending direction of the first shielding line, an extending direction of the second part is approximately parallel to the extending direction of the first shielding line, and each of the first parts is connected between two of the second parts.

The second part with a smallest distance from the display area in the second touch signal line with the smallest distance from the at least one first shielding line is disconnected in the layer where the plurality of touch electrodes are located.

Optionally, in the above display substrate according to the embodiments of the disclosure, a resistance value of each of the first touch signal lines is approximately identical to a resistance value of each of the second touch signal lines.

Optionally, in the above display substrate according to the embodiments of the disclosure, a ratio of a line width of the first shielding line to a line width of the touch signal line is greater than or equal to 3.

Optionally, in the above display substrate according to the embodiments of the disclosure, the line width of the first shielding line is 25 μm to 30 μm, and the line width of the touch signal line is 3 μm to 15 μm.

Optionally, in the above display substrate according to the embodiments of the disclosure, the bridge layer further includes a plurality of bridge electrodes.

The plurality of touch electrodes further include a plurality of second touch electrodes extending in a second direction. Each of the touch electrodes includes a plurality of mutually independent touch parts. Adjacent touch parts are connected through the bridge electrode.

The plurality of touch signal lines further include a plurality of third touch signal lines electrically connected to the plurality of second touch electrodes.

The plurality of third touch signal lines extend from the fourth frame area to the second frame area.

Optionally, in the above display substrate according to the embodiments of the disclosure, resistance values of the third touch signal lines are substantially same.

Optionally, in the above display substrate according to the embodiments of the disclosure, the first touch electrodes are touch drive electrodes, and the first touch signal lines and the second touch signal lines are touch drive signal lines; the second touch electrodes are touch sense electrodes, and the third touch signal lines are touch sense signal lines; or the first touch electrodes are touch sense electrodes, and the first touch signal lines and the second touch signal lines are touch sense signal lines; the second touch electrodes are touch drive electrodes, and the third touch signal lines are touch drive signal lines.

Optionally, in the above display substrate according to the embodiments of the disclosure, the signal lines further include: at least one second shielding line, at least one third shielding line, at least one fourth shielding line and at least one fifth shielding line.

The at least one second shielding line is disposed around the plurality of third touch signal lines, and is located on a side of the plurality of third touch signal lines adjacent to the plurality of second touch signal lines.

The at least one third shielding line is disposed around the plurality of third touch signal lines, and is located on a side of the plurality of third touch signal lines away from the display area.

The at least one fourth shielding line is disposed around the plurality of second touch signal lines, and is located on a side of the plurality of second touch signal lines away from the plurality of first touch signal lines.

The at least one fifth shielding line is disposed around the plurality of first touch signal lines, and is located on a side of the plurality of first touch signal lines away from the display area.

In another aspect, embodiments of the disclosure further provide a display device, including the above display substrate.

DETAILED DESCRIPTION

Figure 1:
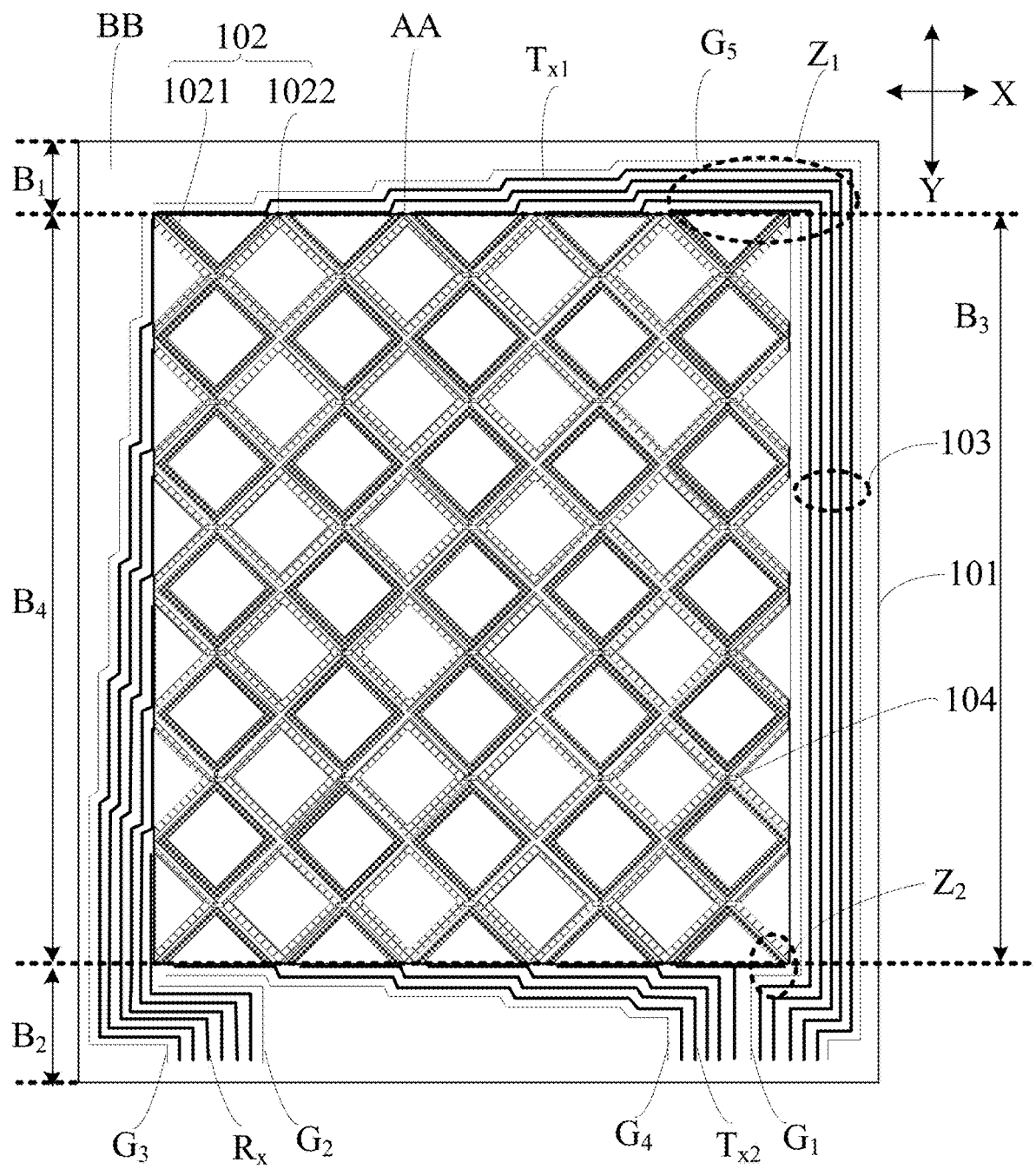
FIG. 1 is a schematic structural diagram of a display substrate according to an embodiment of the disclosure.

In order to make the purposes, technical solutions and advantages of the disclosure clearer, the technical solutions of the embodiments of the disclosure will be described clearly and completely below in combination with the accompanying drawings of the embodiments of the disclosure. It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way. Obviously the described embodiments are a part of the embodiments of the disclosure but not all the embodiments. Based upon the embodiments of the disclosure, all of other embodiments obtained by those ordinary skilled in the art without creative work pertain to the protection scope of the disclosure.

Unless otherwise defined, the technical or scientific terms used here shall have the general meaning understood by those ordinary skilled in the art to which the disclosure belongs. The "first", "second" and similar words used in the specification and claims of the disclosure do not represent any order, quantity or importance, and are only used to distinguish different components. The word such as "include" or "contain" or the like means that the element or object appearing before this word encompasses the elements or objects and their equivalents listed after this word, without excluding other elements or objects. The words such as "inner", "outer", "up", "down" are only used to represent the relative position relationship. When the absolute position of a described object changes, the relative position relationship may also change accordingly.

In the related art, the touch function layer is fabricated by two layers of metal, where one layer is a metal mesh layer (Metal Mesh), and the other layer is a bridge layer (Bridge). The Metal Mesh is located in the display area AA, and may be divided into touch drive electrodes Tx and touch sense electrodes Rx according to the horizontal and vertical directions. Here, among the touch drive electrodes Tx and the touch sense electrodes Rx, one type of electrodes are connected to each other, and the other type of electrodes are connected through the bridge layer. Therefore, there is no need for an external touch module (TSP), which can reduce the thickness of the screen and is thus conducive to folding; and further, there is no fitting tolerance, which can reduce the width of the frame.

Furthermore, in order to provide effective signals to the touch drive electrodes Tx and the touch sense electrodes Rx, a plurality of signal lines are arranged in the frame area around the display area AA. These signal lines are fabricated by one mask plate (mask). If the line widths of two adjacent signal lines differ greatly, the widths of the corresponding patterns on the mask also differ greatly. Since the static electricity (ESD) accumulated on the mask during transport and other processes may be released, the thinner pattern is fused, resulting in a short circuit (short) defect between signal lines fabricated by the mask.

In order to at least solve the above-mentioned technical problems in the related art, embodiments of the disclosure provide a display substrate, as shown in FIG. 1 to FIG. 4. The display substrate may include a base substrate 101, a plurality of touch electrodes 102, and a plurality of signal lines 103.

The base substrate 101 includes a display area AA and a frame area BB around the display area AA.

The plurality of touch electrodes 102 are located in the display area AA.

The plurality of signal lines 103 are located in the frame area BB. At least some of the signal lines 103 are electrically connected to the plurality of touch electrodes 102. The signal lines 103 include a first signal line (such as G1) and a second signal line (such as $T_{x1}$) adjacent to each other. The first signal line (such as G1) and the second signal line (such as $T_{x1}$) respectively include a first-layer wiring (such as TMB layer wiring) and/or a second-layer wiring (such as TMA layer wiring) overlapping with each other in a direction perpendicular to the base substrate 101 and electrically connected to each other. A line width of the first signal line (such as G1) is greater than a line width of the second signal line (such as $T_{x1}$). A ratio of the line width of the first signal line (such as G1) to the line width of the second signal line (such as $T_{x1}$) is greater than 1. At least one of the first signal line (such as G1) and the second signal line (such as $T_{x1}$) in the first-layer wiring (such as TMB layer wiring) is disconnected, and the second-layer wiring (such as TMA layer wiring) of the first signal line (such as G1) is continuous in the disconnected position.

In the above display substrate according to the embodiments of the disclosure, at least one of the first signal line (such as G1) and the second signal line (such as $T_{x1}$) with a large difference in line width is broken in a single layer, so that the pattern corresponding to the disconnected signal line 103 in the mask used for fabricating the line breakage layer is disconnected, thus reducing the accumulation of static electricity on the disconnected signal line 103 and reducing the risk of short circuit caused by the excessive static electricity. Also, the second-layer wiring of the first signal line (such as G1) is continuous, so that the line breakage layer of the first signal line (such as G1) can be electrically connected through the continuous layer, thereby ensuring the smoothness of the signal transmitted on the first signal line (such as G1). Similarly, the second-layer wiring of the second signal line (such as $T_{x1}$) can also be continuous in the disconnected position, so as to ensure the smoothness of the signal transmitted on the second signal line (such as $T_{x1}$).

It should be noted that one fracture D may be arranged on one signal line 103 or a plurality of fractures D may be arranged on one signal line 103 in the disclosure, which is not limited here. The length of each fracture D in the extending direction of the signal line 103 is not limited, and can be flexibly set, for example, the length of the fracture D can be about 10 μm. Furthermore, the line width of the signal line 103 may refer to the width in the direction perpendicular to the extending direction of the signal line 103 in the disclosure.

Optionally, in the above display substrate according to the embodiments of the disclosure, in order to effectively reduce the risk of short circuit, in the first-layer wiring (such as TMB layer wiring), the second signal line (such as $T_{x1}$, $T_{x2}$) is disconnected, and the first signal line (such as G1) is continuous in a disconnected position (that is, the first signal line is continuous in the first-layer wiring).

Optionally, the above display substrate according to the embodiments of the disclosure, as shown in FIG. 2 to FIG. 5, may further include: a bridge layer (i.e., TMA layer) between the base substrate 101 and a layer (i.e., TMB layer) where the plurality of touch electrodes 102 are located, and an insulating layer 117 between the bridge layer TMA and the layer TMB where the plurality of touch electrodes 102 are located. The first-layer wiring of the signal lines 103 is arranged in a same layer as the plurality of touch electrodes 102, and the second-layer wiring is arranged in a same layer as the bridge layer TMA.

Since the layer TMB where the plurality of touch electrodes 102 are located is located above the bridge layer TMA, each signal line 103 in the bridge layer TMA is continuously arranged to facilitate the electrical connection of the broken line of the signal line 103 in the layer TMB where the plurality of touch electrodes 102 are located to the corresponding wiring in the bridge layer TMA. Furthermore, the double-layer wiring structure of the signal line 103 can effectively reduce the resistance value of the signal line 103. In some embodiments, a via hole may be provided in the insulating layer every preset distance (for example, 100 μm), so that the two layers of wiring of the signal line 103 are electrically connected via the via hole.

Optionally, in the above display substrate according to the embodiments of the disclosure, as shown in FIG. 1, the signal lines 103 may include a plurality of touch signal lines (such as $T_{x1}$, $T_{x2}$ and $R_x$) and at least one first shielding line $G_1$. The plurality of touch signal lines (such as $T_{x1}$, $T_{x2}$ and $R_x$) are electrically connected to the plurality of touch electrodes 102. The at least one first shielding line $G_1$ is floating (that is, loaded with no signal), loaded with a fixed potential (such as first power supply signal VDD, second power supply signal VSS, initialization signal Vinit, etc.), or loaded with a same signal as the touch signal lines (such as $T_{x1}$, $T_{x2}$). The second signal line may be a touch signal line (such as $T_{x1}$, $T_{x2}$), and the first signal line may be a first shielded line $G_1$. The first shielding line $G_1$ with a larger line width can effectively shield the interference of the signal loaded on the second touch electrode 1022 in the display area AA to the first touch signal line $T_{x1}$.

Figure 2:
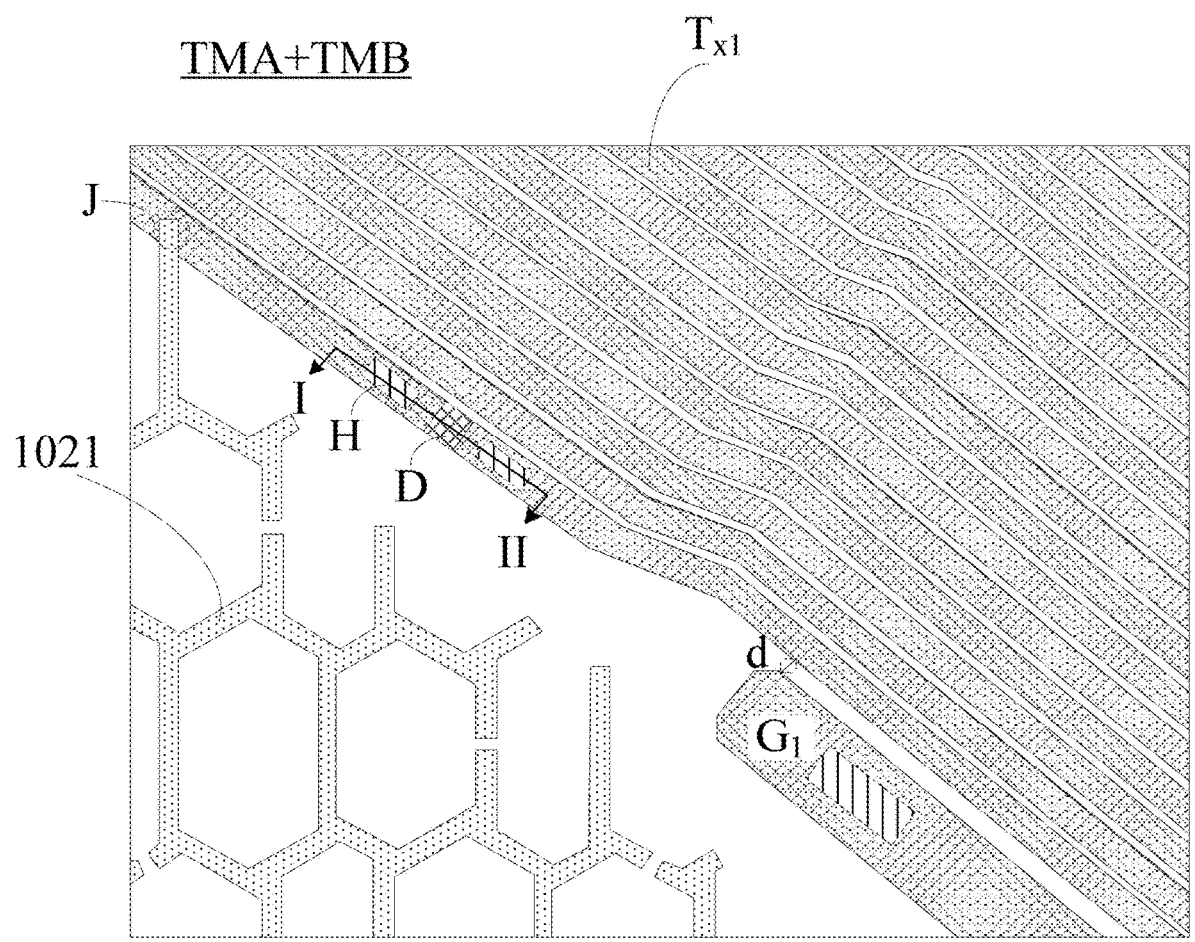
FIG. 2 is a schematic diagram of an enlarged structure of the area $Z_1$ in FIG. 1.
Figure 6:
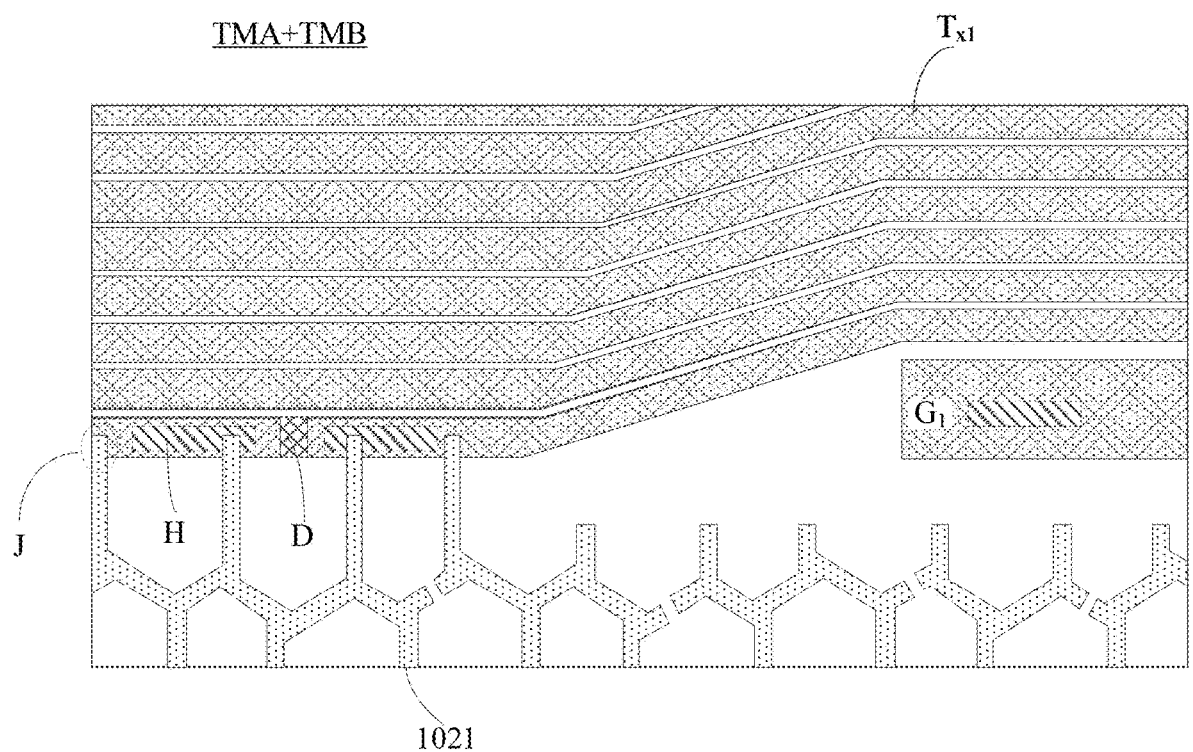
FIG. 6 is a schematic diagram of another enlarged structure of the area $Z_1$ in FIG. 1.
Figure 9:
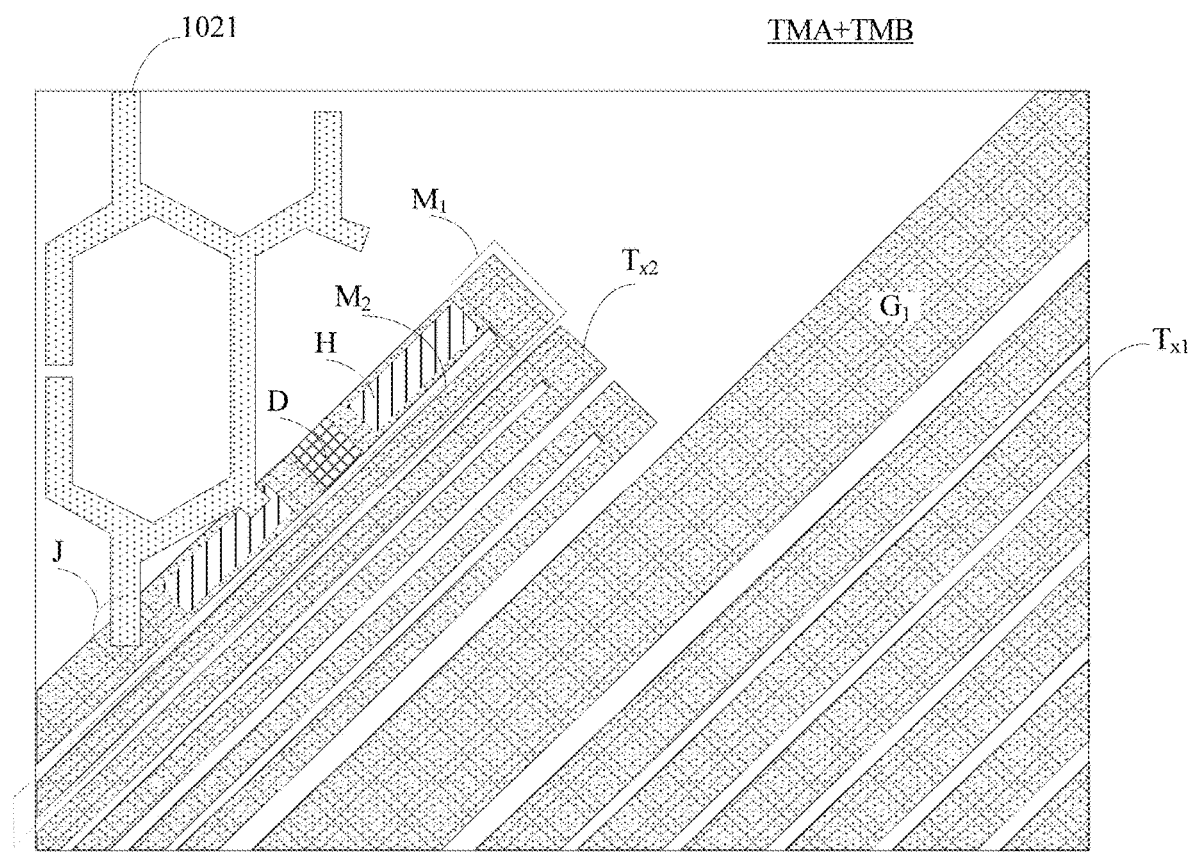
FIG. 9 is a schematic diagram of an enlarged structure of the area $Z_2$ in FIG. 1.

Optionally, in the above display substrate according to the embodiments of the disclosure, as shown in FIG. 2, FIG. 6 and FIG. 9, a position where the touch signal line (such as the first touch signal line $T_{x1}$ or the second touch signal line $T_{x2}$) is electrically connected to the corresponding touch electrode 102 is an intersection point J, a position where the touch signal line (such as the first touch signal line $T_{x1}$ or the second touch signal line $T_{x2}$) is disconnected is a fracture D, and a minimum distance between a center point of the fracture D and the intersection point J is less than or equal to 100 μm. Such arrangement can make the fracture D avoid the intersection point J, effectively ensuring the good electrical connection between the touch signal line (such as the first touch signal line $T_{x1}$ or the second touch signal line $T_{x2}$) and the corresponding touch electrode 102. In some embodiments, as shown in FIG. 2, FIG. 6 and FIG. 9, the intersection point J and the fracture D are located on the same touch signal line (such as the first touch signal line $T_{x1}$ or the second touch signal line $T_{x2}$).

Optionally, in the above display substrate according to the embodiments of the disclosure, as shown in FIG. 2 and FIG. 9, the fracture D may be located between the intersection point J and an end of the first shielding line $G_1$ close to the intersection point J. In the area between the intersection point J and the end of the first shielding line $G_1$ close to the intersection point J, the line width of the touch signal line (such as the first touch signal line $T_{x1}$ and the second touch signal line $T_{x2}$) is relatively large, so if the line breakage is in this area, it is more convenient to arrange the via hole H in the insulating layer, and electrically connect the touch signal line (such as the first touch signal line $T_{x1}$ and the second touch signal line $T_{x2}$) on both sides of the fracture D to the corresponding wiring in the bridge layer TMA.

Optionally, in the above display substrate according to the embodiments of the disclosure, as shown in FIG. 6, there may be a plurality of intersection points J. In this situation, the fracture D may be arranged between adjacent intersection points J. The line width of the first touch signal line $T_{x1}$ in the area where it accesses the display area AA is the largest. When the line width of the first touch signal line $T_{x1}$ in the area between the intersection point J and the end of the first shielding line $G_1$ close to the intersection point J is relatively narrow, which is not conducive to the hole punching process, the first touch signal line $T_{x1}$ may be selected to be disconnected in the area where it accesses the display area AA to facilitate the hole punching process and the connection with the corresponding wiring in the bridge layer TMA through the punched via hole.

Optionally, in the above display substrate according to the embodiments of the disclosure, as shown in FIG. 2, FIG. 6 and FIG. 9, via holes H penetrating the insulating layer are respectively arranged on both sides of the fracture D. The corresponding first-layer wiring and second-layer wiring are electrically connected through the via holes, so as to ensure the smoothness of the signal transmitted on the signal line 103.

Optionally, in the above display substrate according to the embodiments of the disclosure, a distance between the via hole H and the fracture D is approximately 4 μm to 20 μm. In this way, the via hole H can avoid the fracture D, effectively ensuring the good electrical connection between two layers of wiring of the touch signal line.

Figure 5:
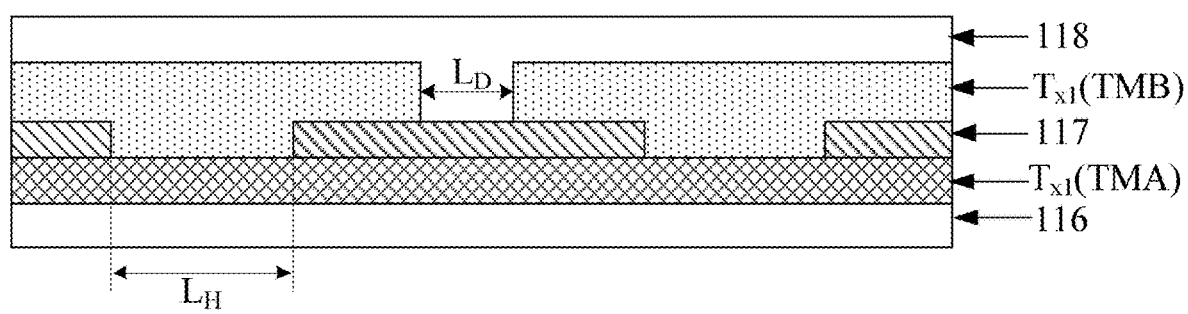
FIG. 5 is a schematic diagram of a cross-sectional structure along the line I-II in FIG. 2.

Optionally, in the above display substrate according to the embodiments of the disclosure, as shown in FIG. 5, a length Ly of the via hole H is greater than a length $L_D$ of the fracture D in an extending direction of the signal line 103 (such as the first touch signal line $T_{x1}$ and the second touch signal line $T_{x2}$).

It should be understood that, limited by the line widths of the first touch signal line $T_{x1}$ and the second touch signal line $T_{x2}$, the size of the via hole H should not be too large. When the size of the via hole H is too small, the hole punching effect will be affected (for example, the via hole may not be formed), and the via hole may not even be made. Therefore, in order to improve the electrical connection effect, the length of the via hole H may be set to be greater than the length of the fracture D. In some embodiments, the length of the via hole H in the extending direction of the first touch signal line $T_{x1}$ or the second touch signal line $T_{x2}$ is about 30 μm, and the width of the via hole H in the direction perpendicular to the extending direction of the first touch signal line $T_{x1}$ or the second touch signal line $T_{x2}$ is about 5 μm.

Optionally, in the above display substrate according to the embodiments of the disclosure, the ratio of the length of the via hole H to the length of the fracture D may be greater than 1.25, so that the size of the via hole H meets the technical effect of effectively electrically connecting two layers of wiring.

Optionally, in the above display substrate according to the embodiments of the disclosure, the ratio of the length of the fracture D in the extending direction of the signal line 103 to the width of the fracture D in the direction perpendicular to the extending direction of the signal line 103 may be less than 1 (for example, may be 0.5), so as to break the single layer of the signal line 103 (such as the first touch signal line $T_{x1}$ and the second touch signal line $T_{x2}$) through the fracture D.

Optionally, in the above display substrate according to the embodiments of the disclosure, as shown in FIG. 1, the plurality of touch electrodes 102 may include: a plurality of first touch electrodes 1021 extending in a first direction Y.

The plurality of touch signal lines (such as $T_{x1}$, $T_{x2}$ and $R_x$) may include a plurality of first touch signal lines $T_{x1}$ and a plurality of second touch signal lines $T_{x2}$. The plurality of first touch signal lines $T_{x1}$ and the plurality of second touch signal lines $T_{x2}$ are electrically connected to the plurality of first touch electrodes 1021 respectively.

The frame area BB includes: a first frame area $B_1$, a second frame area $B_2$, a third frame area $B_3$ and a fourth frame area $B_4$. The first frame area $B_1$ and the second frame area $B_2$ are respectively located on two ends of an extending direction of the first touch electrodes 1021, and the third frame area $B_3$ and the fourth frame area $B_4$ are respectively located on two sides of the extending direction of the first touch electrodes 1021.

The plurality of first touch signal lines $T_{x1}$ extend from the first frame area $B_1$ through the third frame area $B_3$ to the second frame area $B_2$. The plurality of second touch signal lines $T_{x2}$ are located in the second frame area $B_2$.

Here, the at least one first shielding line $G_1$ may be located between the plurality of first touch signal lines $T_{x1}$ and the display area AA, and the first shielding line $G_1$ is arranged around the plurality of first touch signal lines $T_{x1}$. At least one of the at least one first shielding line $G_1$, the first touch signal line $T_{x1}$ with the smallest distance from the first shielding line $G_1$, or the second touch signal line $T_{x2}$ with the smallest distance from the first shielding line $G_1$ is disconnected in the layer where the plurality of touch electrodes 102 are located, and each signal line 103 in the bridge layer TMA is continuous.

Optionally, in the above display substrate according to the embodiments of the disclosure, as shown in FIG. 2 to FIG. 8, the first touch signal line $T_{x1}$ with the smallest distance from the at least one first shielding line $G_1$ may be disconnected in the layer TMB where the plurality of touch electrodes 102 are located.

It can be seen from FIG. 1 that the winding of the first touch signal line $T_{x1}$ is relatively long, so the static electricity accumulated on the corresponding mask pattern is more. Thus, the disconnection of the first touch signal line $T_{x1}$ can reduce the risk of short circuit caused by the static electricity to the greatest extent.

Furthermore, it can be seen from FIG. 1 that the wiring density of the signal line 103 gradually increases in the process of winding the first touch signal line $T_{x1}$ from the first frame area $B_1$ through the third frame area $B_3$ to the second frame area $B_2$. Therefore, in the case where the space of the frame area BB is limited, the line width of the signal line 103 will gradually become smaller. For example, for the signal line 103, the line width in the first frame area $B_1$ may be 7 μm to 10 μm, the line widths in the second frame area $B_2$ and the third frame area $B_3$ may be 3 μm to 7 μm, and the line width in the third frame area $B_3$ is larger than the line width in the second frame area $B_2$. Optionally, in the above display substrate according to the embodiments of the disclosure, as shown in FIG. 9 to FIG. 11, the second touch signal line $T_{x2}$ with the smallest distance from the at least one first shielding line $G_1$ may be disconnected in the layer TMB where the plurality of touch electrodes 102 are located.

By disconnecting the second touch signal line $T_{x2}$ closest to the at least one first shielding line $G_1$, the mask pattern corresponding to the second touch signal line $T_{x2}$ is disconnected, thereby effectively reducing the risk of short circuit due to the excess accumulation of the static electricity.

Figure 10:
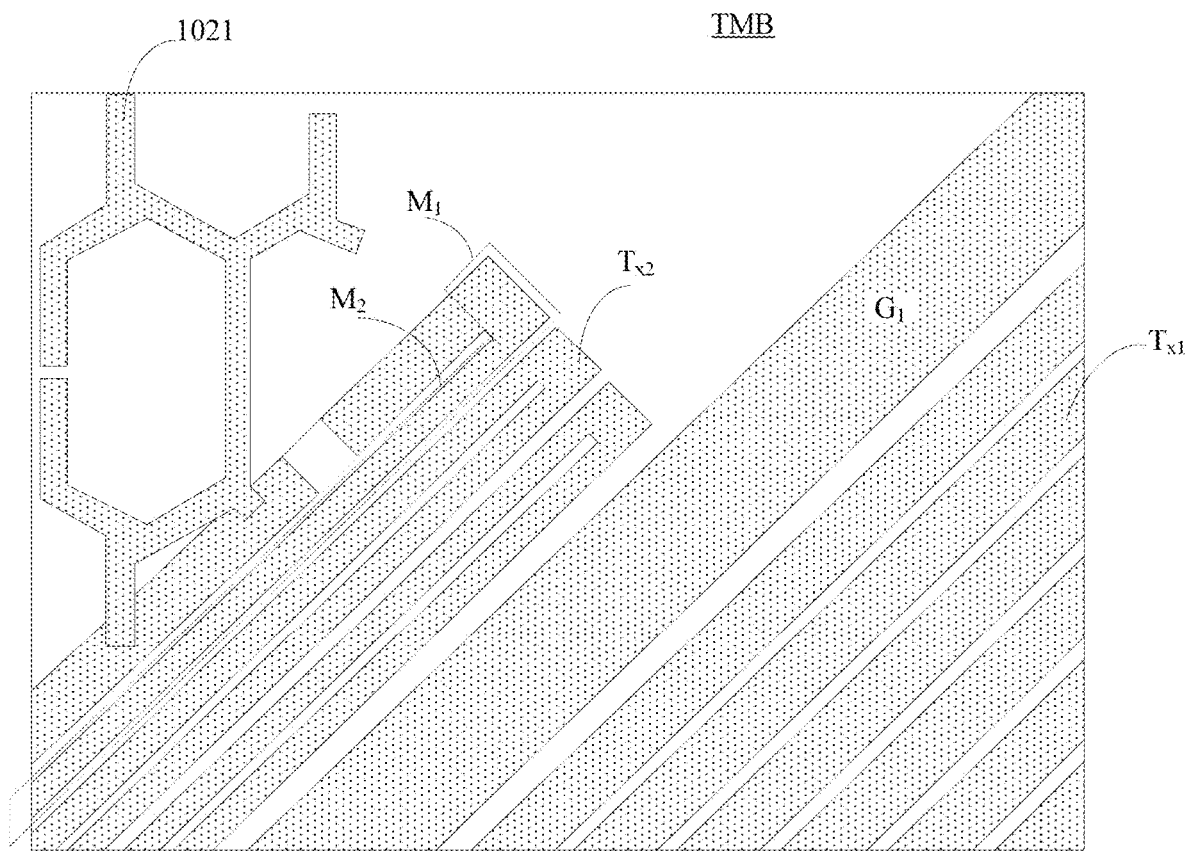
FIG. 10 is a schematic structural diagram of a layer the touch electrodes are located in FIG. 9.
Figure 11:
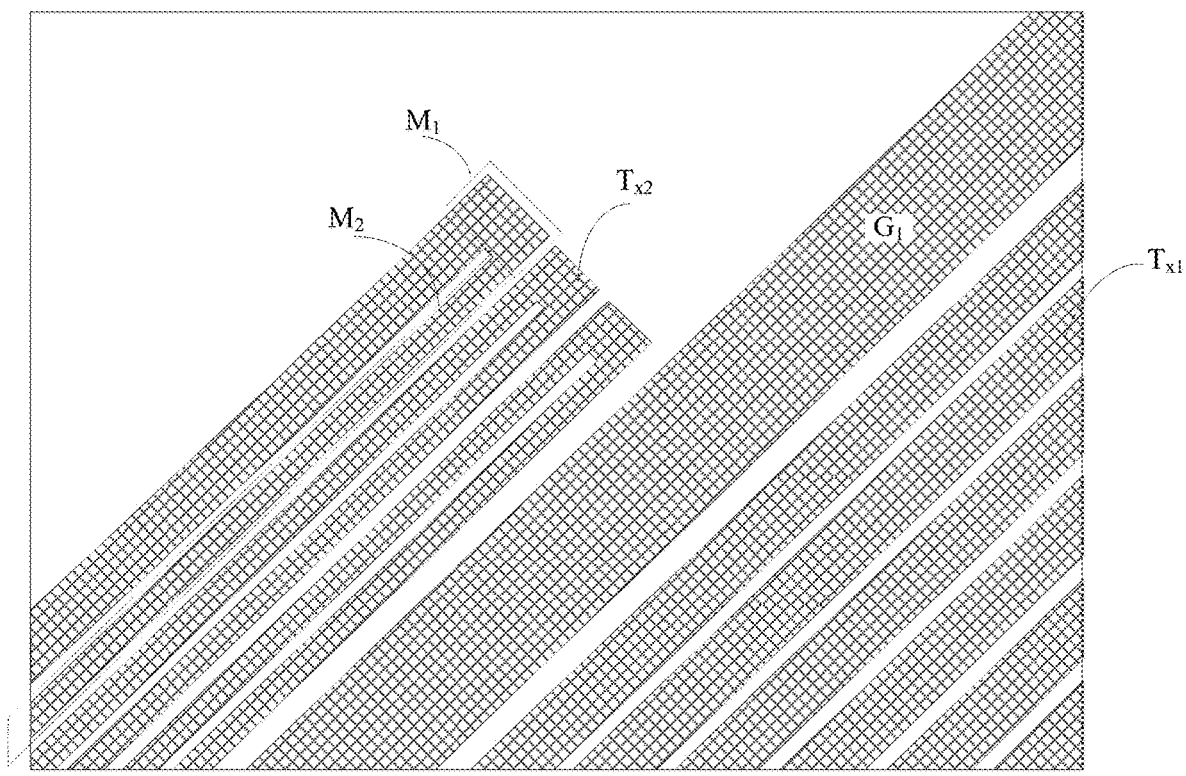
FIG. 11 is a schematic structural diagram of a bridge layer in FIG. 9.

Optionally, in the above display substrate according to the embodiments of the disclosure, as shown in FIG. 9 to FIG. 11, each second touch signal line $T_{x2}$ may include a plurality of first parts $M_1$ and a plurality of second parts $M_2$. An extending direction of the first part $M_1$ intersects with an extending direction of the first shielding line $G_1$. An extending direction of the second part $M_2$ is approximately parallel to the extending direction of the first shielding line $G_1$. Each first part $M_1$ is connected between two second parts $M_2$.

The second part $M_2$ with the smallest distance from the display area AA in the second touch signal line $T_{x2}$ with the smallest distance from the at least one first shielding line $G_1$ is disconnected in the layer TMB where the plurality of touch electrodes 102 are located.

It can be seen from FIG. 9 to FIG. 11 that the line width of the second part $M_2$ with the smallest distance from the display area AA is the largest. Therefore, in order to facilitate the punching connection, preferably the second part $M_2$ with the smallest distance from the display area AA in the second touch signal line $T_{x2}$ closest to the first shielding line $G_1$ is disconnected.

Optionally, in the above display substrate according to the embodiments of the disclosure, the resistance value of each first touch signal line $T_{x1}$ is approximately identical to the resistance value of each second touch signal line $T_{x2}$. This setting can make the signal delay (RC delay) effects of each first touch signal line $T_{x1}$ and each second touch signal line $T_{x2}$ basically consistent, so that the magnitudes of the signals loaded on the first touch electrodes 1021 electrically connected to the first touch signal lines $T_{x1}$ and the second touch signal lines $T_{x2}$ are substantially the same, thereby improving the touch effect.

In some embodiments, the resistance value of the second touch signal line $T_{x2}$ is made to be approximately identical to the resistance value of the first touch signal line $T_{x1}$ by winding the second touch signal line $T_{x2}$ as described above. Further, other methods can also be used, for example, if the manufacturing process allows, the length and line width of the second touch signal line $T_{x2}$ can be made smaller than those of the first touch signal line $T_{x1}$.

Figure 3:
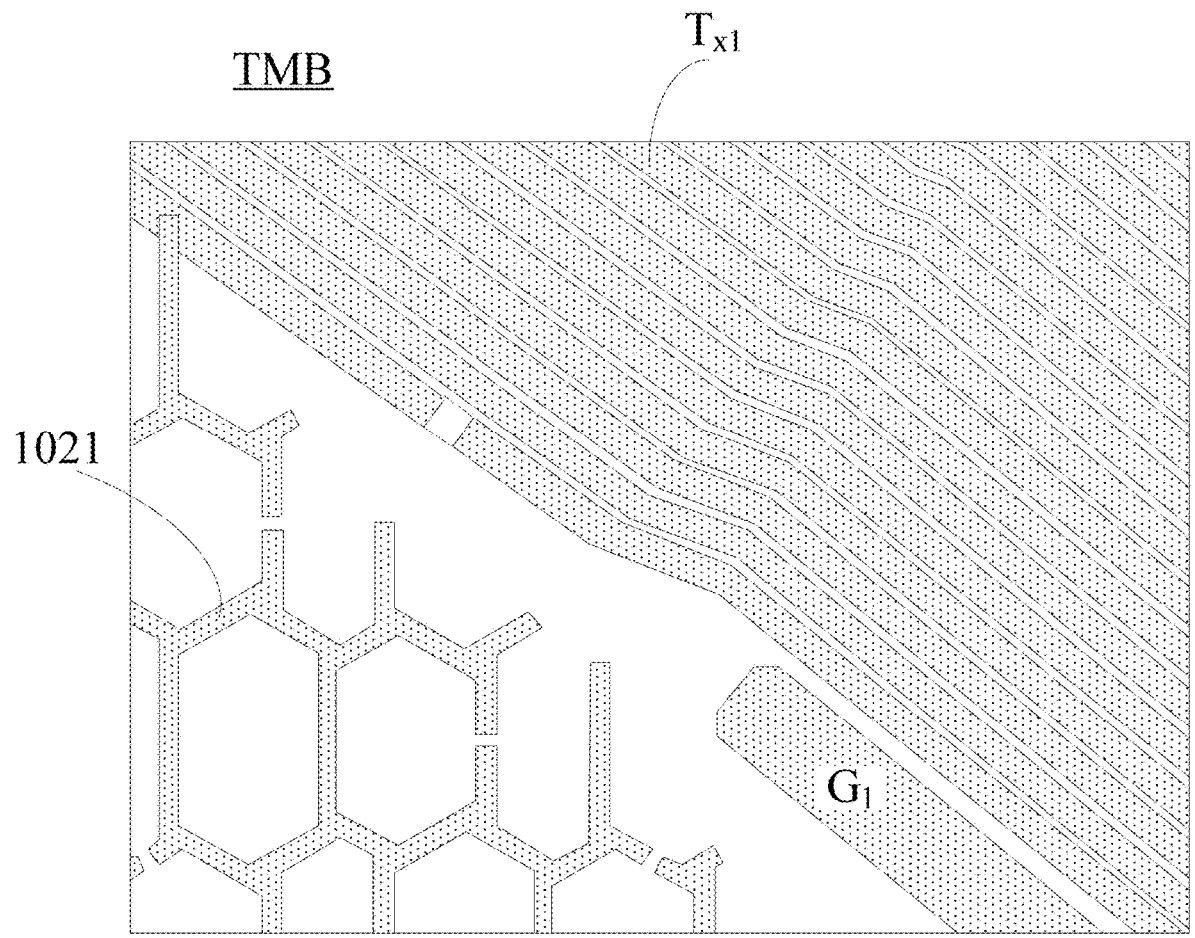
FIG. 3 is a schematic structural diagram of a layer where touch electrodes are located in FIG. 2.
Figure 4:
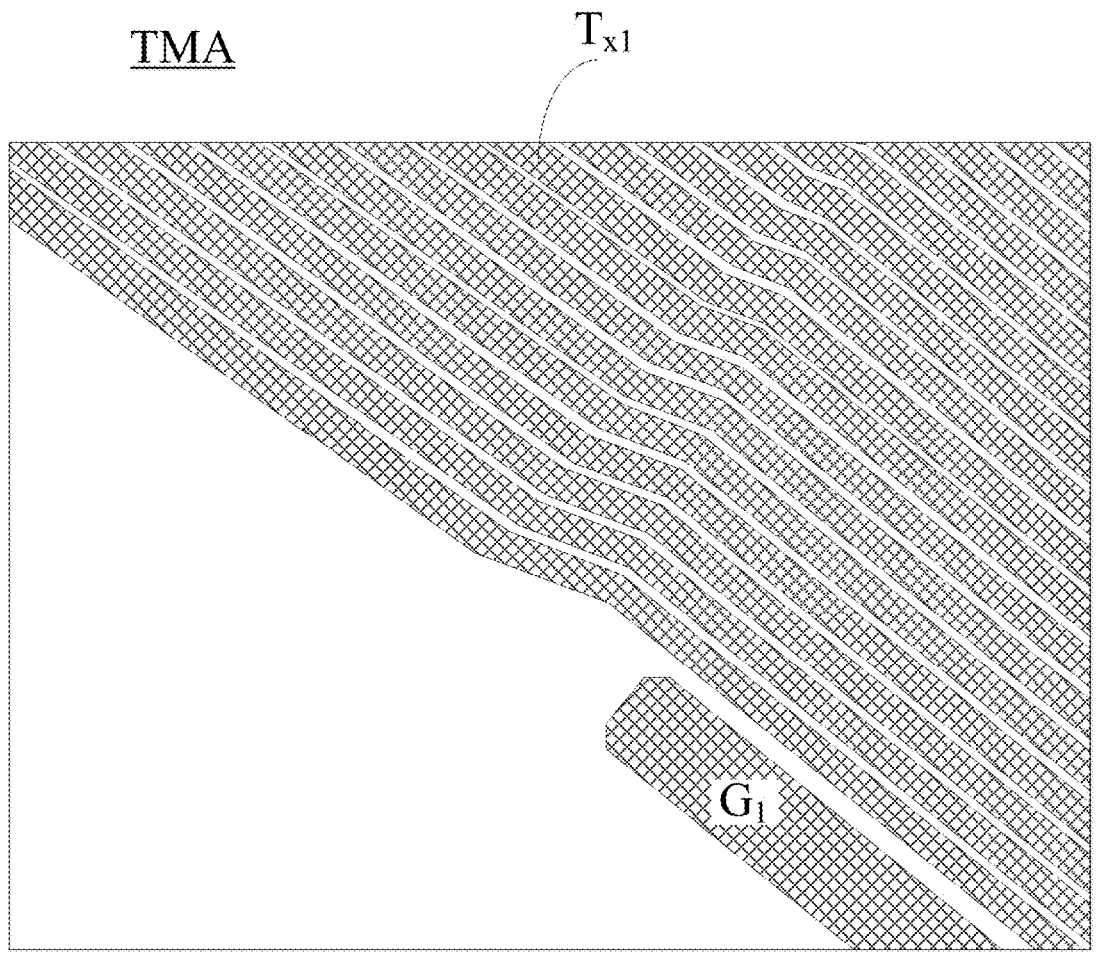
FIG. 4 is a schematic structural diagram of a bridge layer in FIG. 2.
Figure 7:
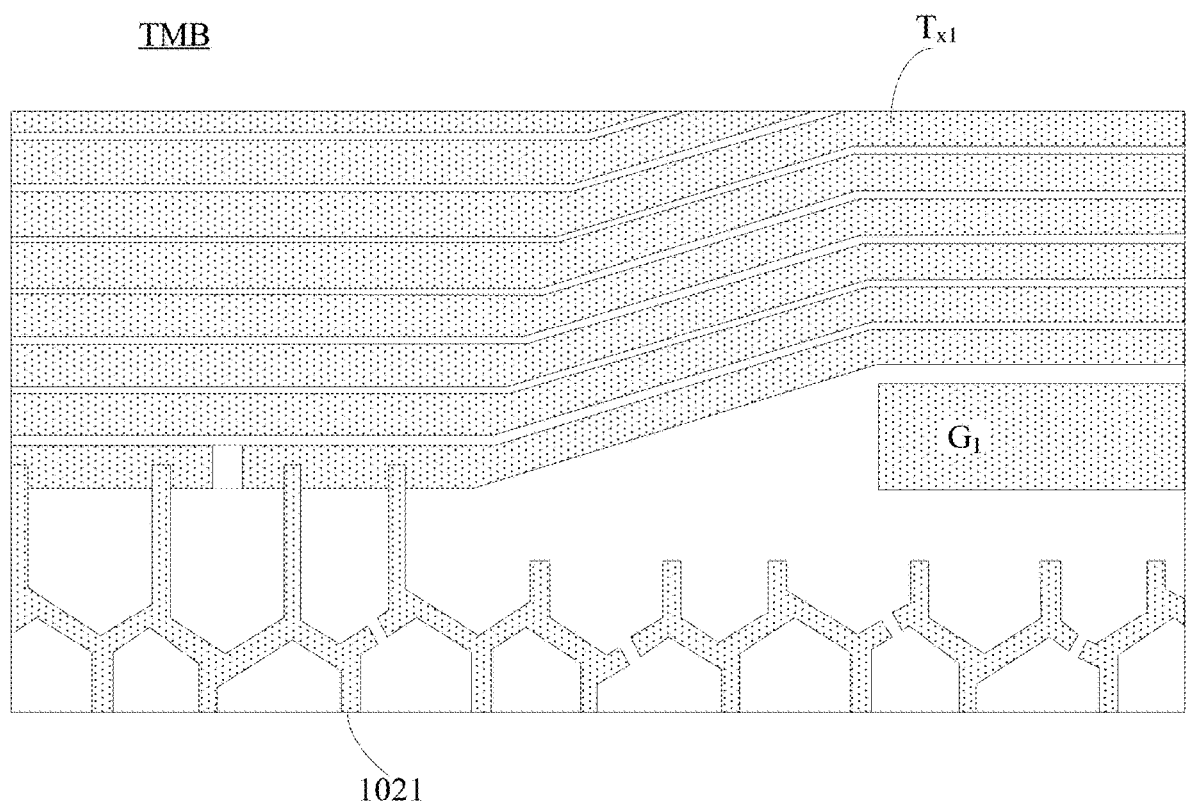
FIG. 7 is a schematic structural diagram of a layer where touch electrodes are located in FIG. 6.
Figure 8:
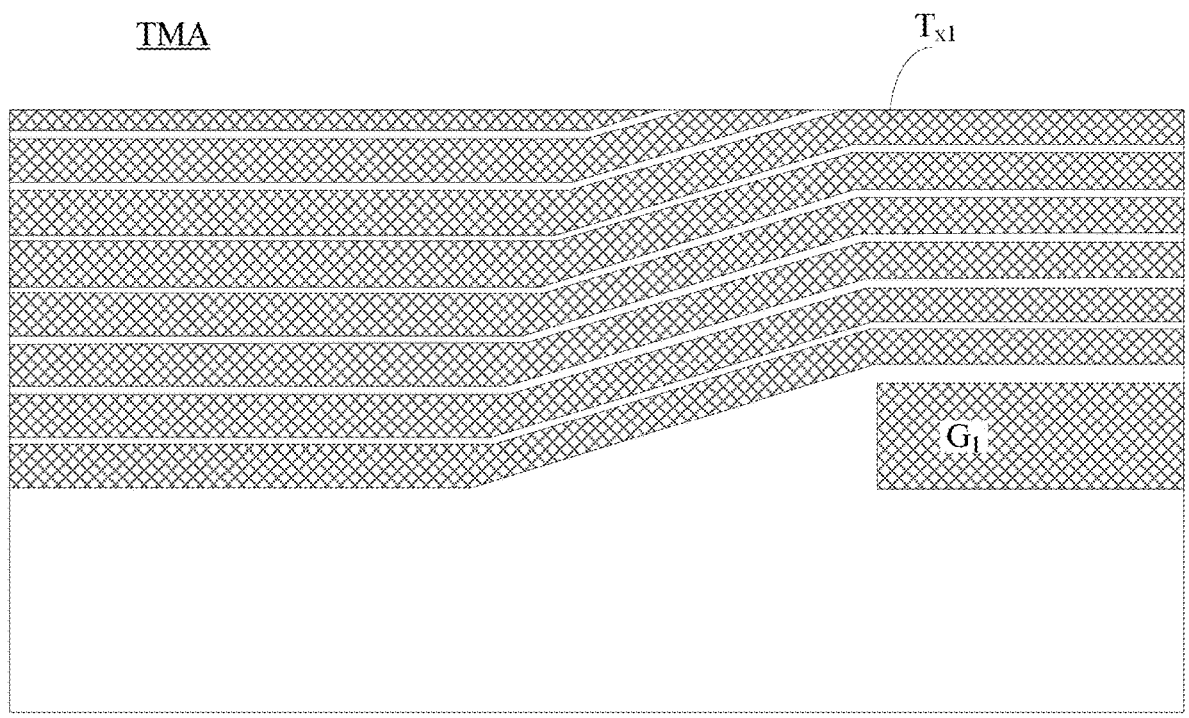
FIG. 8 is a schematic structural diagram of a bridge layer in FIG. 6.

Optionally, in the above display substrate according to the embodiments of the disclosure, as shown in FIG. 3, FIG. 7 and FIG. 10, after the first touch signal line $T_{x1}$ and the second touch signal line $T_{x2}$ closest to the first shielding line $G_1$ are disconnected in the layer TMB where the plurality of touch electrodes 102 are located, it is found in the disclosure that the risk of short circuit caused by the excessive static electricity can be well reduced. Thus each first shielding line $G_1$ can be continuously arranged in the layer TMB where the plurality of touch electrodes 102 are located in the disclosure. Further, in some implementations, the first shielding line $G_1$ may also be disconnected in the layer TMB where the plurality of touch electrodes 102 are located, which is not limited here.

Optionally, in the above display substrate according to the embodiments of the disclosure, as shown in FIG. 2 to FIG. 11, the line width of the first shielding line $G_1$ is greater than the line width of the touch signal line (such as $T_{x1}$, $T_{x2}$ and $R_x$), and the ratio of the line width of the first shielding line $G_1$ to the line width of the touch signal line (such as $T_{x1}$, $T_{x2}$ and $R_x$) may be greater than or equal to 3. In some embodiments, the line width of the first shielding line $G_1$ may be 25 μm to 30 μm (such as 27 μm), and the line width of the touch signal line (such as $T_{x1}$, $T_{x2}$ and $R_x$) is 3 μm to 15 μm (such as 9 μm).

It should be noted that the line width of the touch signal line (such as $T_{x1}$, $T_{x2}$ and $R_x$) in the disclosure is gradually varied, so the line width of the first shielding line $G_1$ may be gradually varied, so that the line widths of a part of the first shielding line $G_1$ and the adjacent part of the touch signal line satisfy the same proportional relationship, and it is conducive to realizing a fixed gap width between the first shielding line $G_1$ and the touch signal line. Further, the line width of the first shielding line $G_1$ can also be a fixed value, as long as the fixed value and the maximum line width of the touch signal line satisfy the above proportional relationship.

Optionally, in the above display substrate according to the embodiments of the disclosure, as shown in FIG. 2, the distance between the first signal line (such as the first shielding line $G_1$ in FIG. 2) and the second signal line (such as the first touch signal lines $T_{x1}$ in FIG. 2) in the same wiring layer may be 2 μm to 10 μm.

The disclosure can effectively improve the short-circuit failure caused by the static electricity through the above-mentioned disconnection method. The first signal line (such as the first shielding line $G_1$ in FIG. 2) is insulated from the second signal line (such as the first touch signal lines $T_{x1}$ in FIG. 2) by a gap, and the width of the gap may be set to be small, for example, less than 5 μm. Further, if the space of the frame area BB permits, the distance between the first signal line (such as the first shielding line $G_1$ in FIG. 2) and the second signal line (such as the first touch signal lines $T_{x1}$ in FIG. 2) in the same wiring layer may also be set as 7 μm to 10 μm, thus effectively avoiding the electrostatic contact between the mask patterns corresponding to two adjacent signal lines 103. The electrostatic contact results in a sudden increase of the static electricity on a single signal line 103 and easy melting of the mask pattern, so that the first signal line (such as the first shielding line $G_1$ in FIG. 2) and the second signal line (such as the first touch signal line $T_{x1}$ in FIG. 2) fabricated by this mask plate are short-circuited subsequently.

Optionally, in the above display substrate according to the embodiments of the disclosure, as shown in FIG. 1, the bridge layer TMA may further include a plurality of bridge electrodes 104.

The plurality of touch electrodes 102 may further include a plurality of second touch electrodes 1022 extending in a second direction X. Each touch electrode 1022 includes a plurality of mutually independent touch parts, and adjacent touch parts are connected through the bridge electrode 104.

The plurality of touch signal lines may further include a plurality of third touch signal lines $R_x$ electrically connected to the plurality of second touch electrodes 1022.

The plurality of third touch signal lines $R_x$ extend from the fourth frame area $B_4$ to the second frame area $B_2$.

As can be seen from FIG. 1, in the disclosure, the first touch signal lines $T_{x1}$ and the second touch signal lines $T_{x2}$ electrically connected to the first touch electrodes 1021 access the display area AA respectively from the first frame area $B_1$ and the second frame area $B_2$, and the first touch signal lines $T_{x1}$ are wound in the third frame area $B_3$. The third touch signal lines $R_x$ electrically connected to the second touch electrodes 1022 access the display area AA from the fourth frame area $B_4$. In some embodiments, the first touch signal lines $T_{x1}$ and the second touch signal lines $T_{x2}$ electrically connected to the first touch electrodes 1021 may also access the display area AA respectively from the first frame area $B_1$ and the second frame area $B_2$, and the first touch signal lines $T_{x1}$ are wound in the fourth frame area $B_4$. The third touch signal lines $R_x$ electrically connected to the second touch electrodes 1022 access the display area AA from the third frame area $B_3$. The wiring manner may be set according to the actual needs, and is not limited here.

Optionally, in the above display substrate according to the embodiments of the disclosure, the resistance values of the third touch signal lines $R_x$ are substantially same. This setting can make the signal delay (RC delay) effects on the third touch signal lines $R_x$ basically consistent, so that the magnitudes of the signals loaded on the second touch electrodes 1022 electrically connected to the third touch signal lines $R_x$ are substantially the same, thereby improving the touch effect.

Optionally, in the above display substrate according to the embodiments of the disclosure, the first touch electrodes 1021 may be touch drive electrodes, and the first touch signal lines $T_{x1}$ and the second touch signal lines $T_{x2}$ may be touch drive signal lines. The second touch electrodes 1022 are touch sense electrodes, and the third touch signal lines $R_x$ are touch sense signal lines. Alternatively, the first touch electrodes 1021 are touch sense electrodes, and the first touch signal lines $T_{x1}$ and the second touch signal lines $T_{x2}$ are touch sense signal lines. The second touch electrodes 1022 are touch drive electrodes, and the third touch signal lines $R_x$ are touch drive signal lines.

Optionally, in the above display substrate according to the embodiments of the disclosure, as shown in FIG. 1, the signal lines 103 may further include: at least one second shielding line $G_2$, at least one third shielding line $G_3$, at least one fourth shielding line $G_4$ and at least one fifth shielding line $G_5$.

The at least one second shielding line $G_2$ is disposed around the plurality of third touch signal lines $R_x$, and is located on a side of the plurality of third touch signal lines $R_x$ adjacent to the plurality of second touch signal lines $T_{x2}$.

The at least one third shielding line $G_3$ is disposed around the plurality of third touch signal lines $R_x$, and is located on a side of the plurality of third touch signal lines $R_x$ away from the display area AA.

The at least one fourth shielding line $G_4$ is disposed around the plurality of second touch signal lines $T_{x2}$, and is located on a side of the plurality of second touch signal lines $T_{x2}$ away from the plurality of first touch signal lines $T_{x1}$.

The at least one fifth shielding line $G_5$ is disposed around the plurality of first touch signal lines $T_{x1}$ and is located on a side of the plurality of first touch signal lines $T_{x1}$ away from the display area AA.

The second shielding line $G_2$ and the fourth shielding line $G_4$ isolate the third touch signal lines $R_x$ from the second touch signal lines $T_{x2}$ effectively, to avoid the mutual crosstalk of the signals on the third touch signal lines $R_x$ and the second touch signal lines $T_{x2}$. The third shielding line $G_3$ isolates the third touch signal lines $R_x$ from the outside, to avoid the external static electricity from interfering with the signals on the third touch signal lines $R_x$. The fifth shielding line $G_5$ isolates the first touch signal lines $T_{x1}$ from the outside, to avoid the external static electricity from interfering with the signals on the first touch signal lines $T_{x1}$.

Furthermore, in implementations, the second shielding line $G_2$, the third shielding line $G_3$, the fourth shielding line $G_4$ and the fifth shielding line $G_5$ may be floating (that is, loaded with no signal), loaded with a fixed potential (such as first power supply signal VDD, second power supply signal VSS, initialization signal Vinit, etc.), or loaded with a same signal as that on the closest touch signal line (such as the first touch signal line $T_{x1}$, the second touch signal line $T_{x2}$ or the third touch signal line $R_x$).

Optionally, in the above display substrate according to the embodiments of the disclosure, the line width of the second shielding line $G_2$ may be set to be approximately the same as the line width of the third touch signal line $R_x$, the line width of the third shielding line $G_3$ may be set to be the same as the line width of the third touch signal line $R_x$, the line width of the fourth shielding line $G_4$ may be set to be approximately the same as the line width of the second touch signal line $T_{x2}$, and the line width of the fifth shielding line $G_5$ may be set to be approximately the same as the line width of the first touch signal line $T_{x1}$.

It is found in the disclosure that the probability of poor short-circuit due to the static electricity between adjacent signal lines is extremely low when the signal lines 103 have approximately the same line width, so the line widths of the second shielding line $G_2$, the third shielding line $G_3$, the fourth shielding line $G_4$ and the fifth shielding line $G_5$ may be respectively set to be approximately the same as the line widths of the adjacent signal lines 103 in the disclosure.

It should be noted that, in the embodiments provided by the disclosure, due to the limitation of process conditions or the influence of other factors such as measurement, the above-mentioned "approximately" may be completely equivalent, or there may be some deviations, so the "approximately" relationship between the above features belongs to the protection scope of the disclosure as long as the relationship satisfies the tolerance of error (for example, the fluctuation of 10% up and down).

Furthermore, for the above display substrate provided by the disclosure, a corresponding manufacturing method is also provided as follows.

Figure 12:
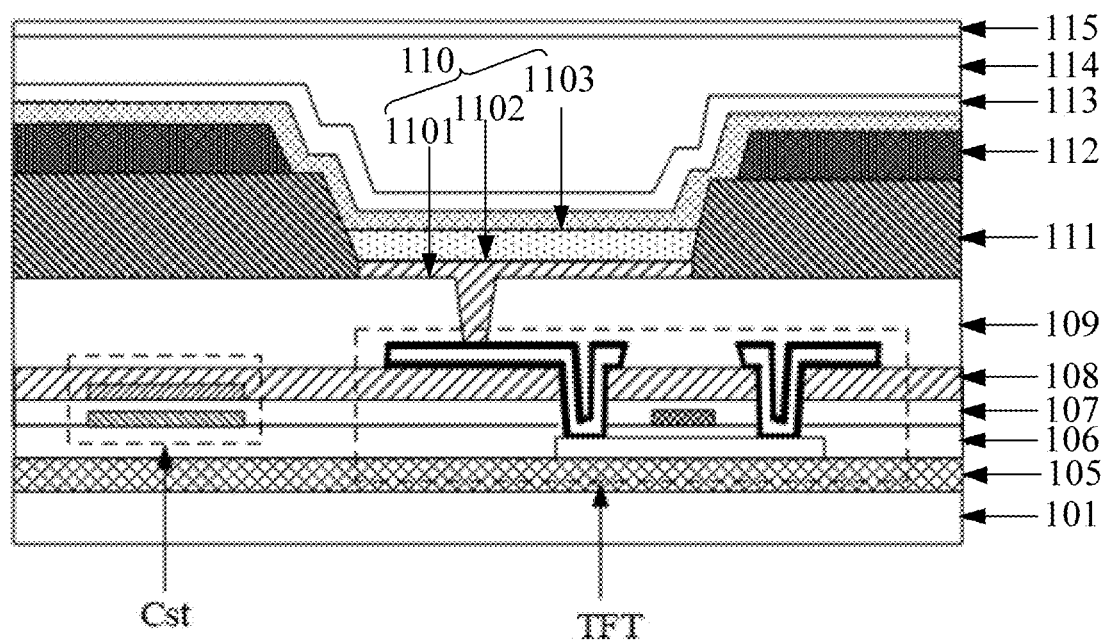
FIG. 12 to FIG. 18 are respectively schematic structural diagrams of the display substrate in the manufacturing process according to embodiments of the disclosure.

Step 1: as shown in FIG. 12, a pixel drive circuit including a transistor TFT and a storage capacitor Cst, a buffer layer 105, a gate insulating layer 106, a first interlayer dielectric layer 107, a second interlayer dielectric layer 108, a planar layer 109, a light-emitting device 110 (including an anode 1101, a light-emitting functional layer 1102 and a cathode 1103), a pixel defining layer 111, a spacer layer 112, a first inorganic encapsulation layer 113, an organic encapsulation layer 114 and a second inorganic encapsulation layer 115 are formed on a base substrate 101. The structures of the above-mentioned film layers are the same as those in the prior art, so the manufacturing method thereof may refer to the related technology, which will not be repeated here.

Figure 13:
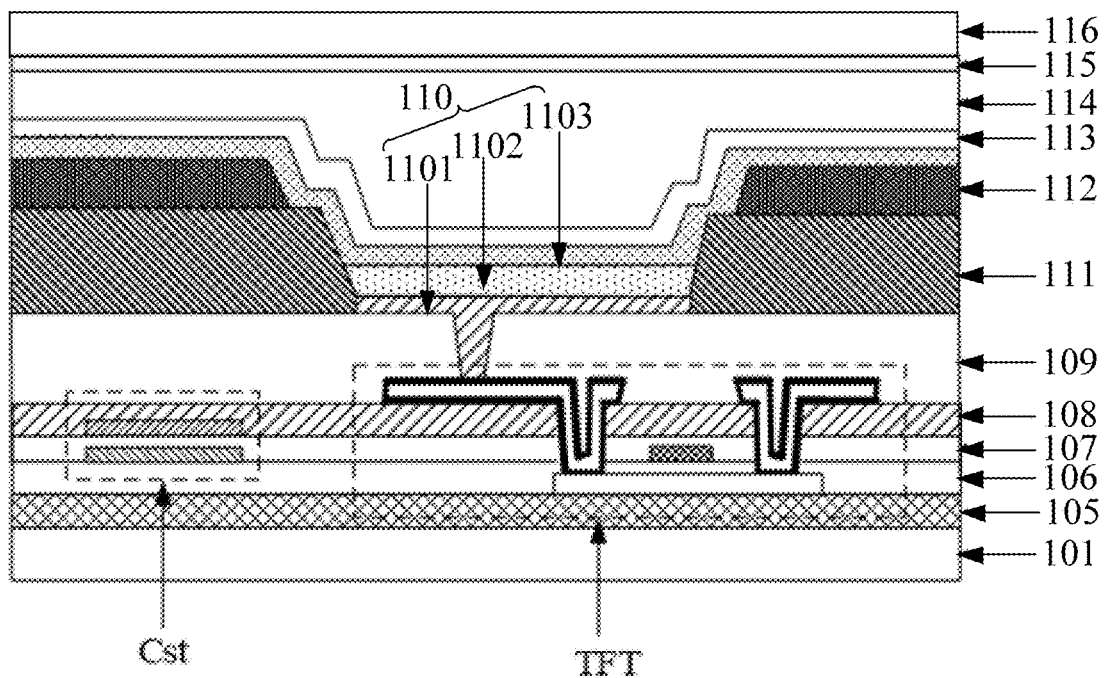

Step 2: as shown in FIG. 13, an etching stopper layer 116 made of silicon nitride is deposited on the second inorganic encapsulation layer 115.

Figure 14:
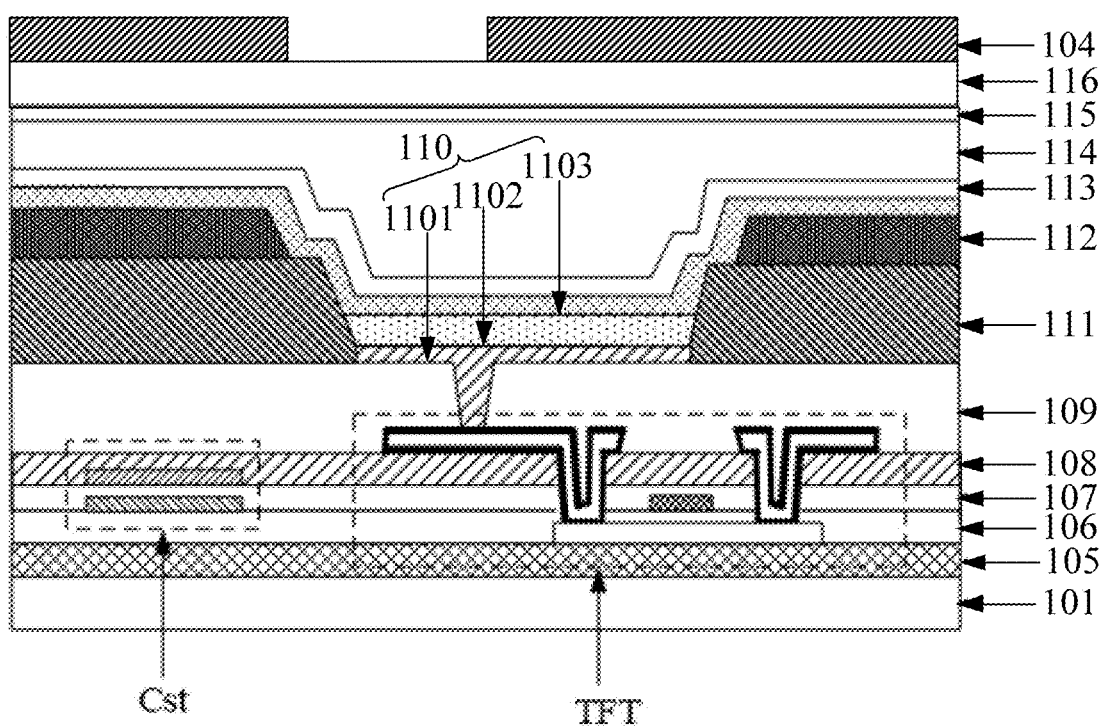

Step 3: as shown in FIG. 14, a titanium metal film, an aluminum metal film and a titanium metal film are sequentially formed on the etching stopper layer 116. The stacked titanium metal film, aluminum metal film and titanium metal film are patterned to form a bridge electrode 104 in a display area AA as well as a first touch signal line $T_{x1}$, a second touch signal line $T_{x2}$, a third touch signal line $R_x$, a first shielding line $G_1$, a second shielding line $G_2$, a third shielding line $G_3$, a fourth shielding line $G_4$ and a fifth shielding line $G_5$ in a frame area BB. The bridge electrode 104 and the above-mentioned signal lines together constitute a bridge layer TMA.

Figure 15:
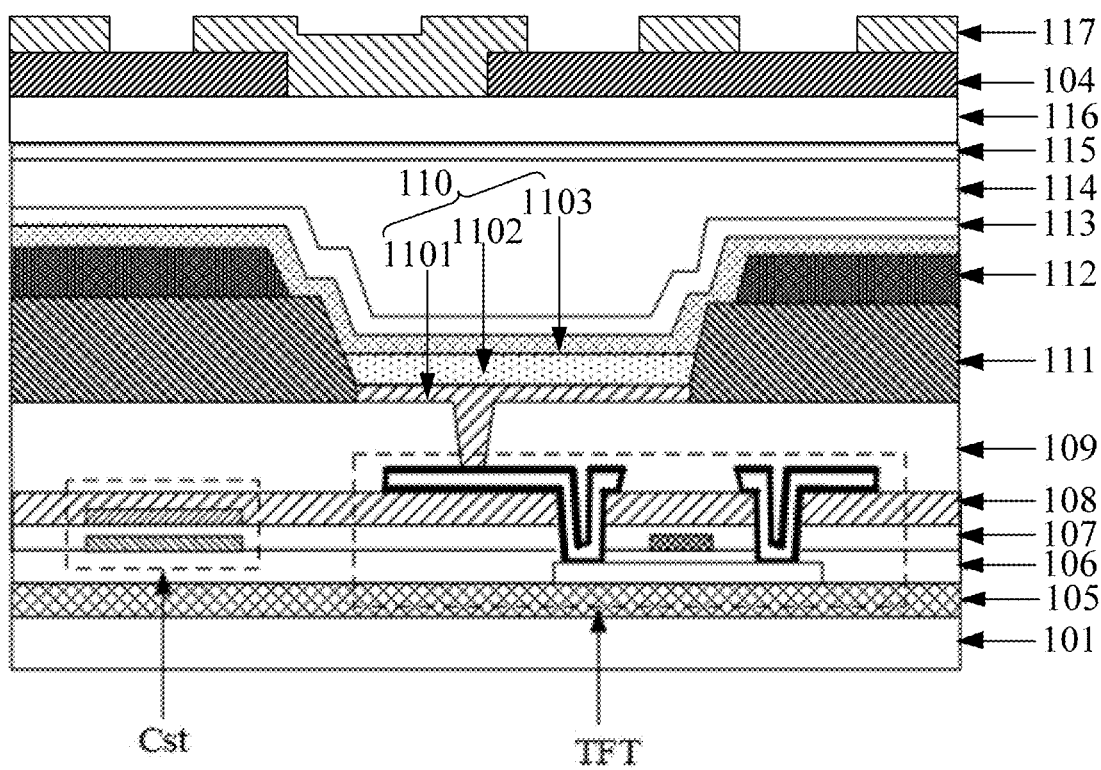

Step 4: as shown in FIG. 15, an insulating layer 117 with a plurality of via holes is formed by patterning on the bridge layer TMA.

Figure 16:
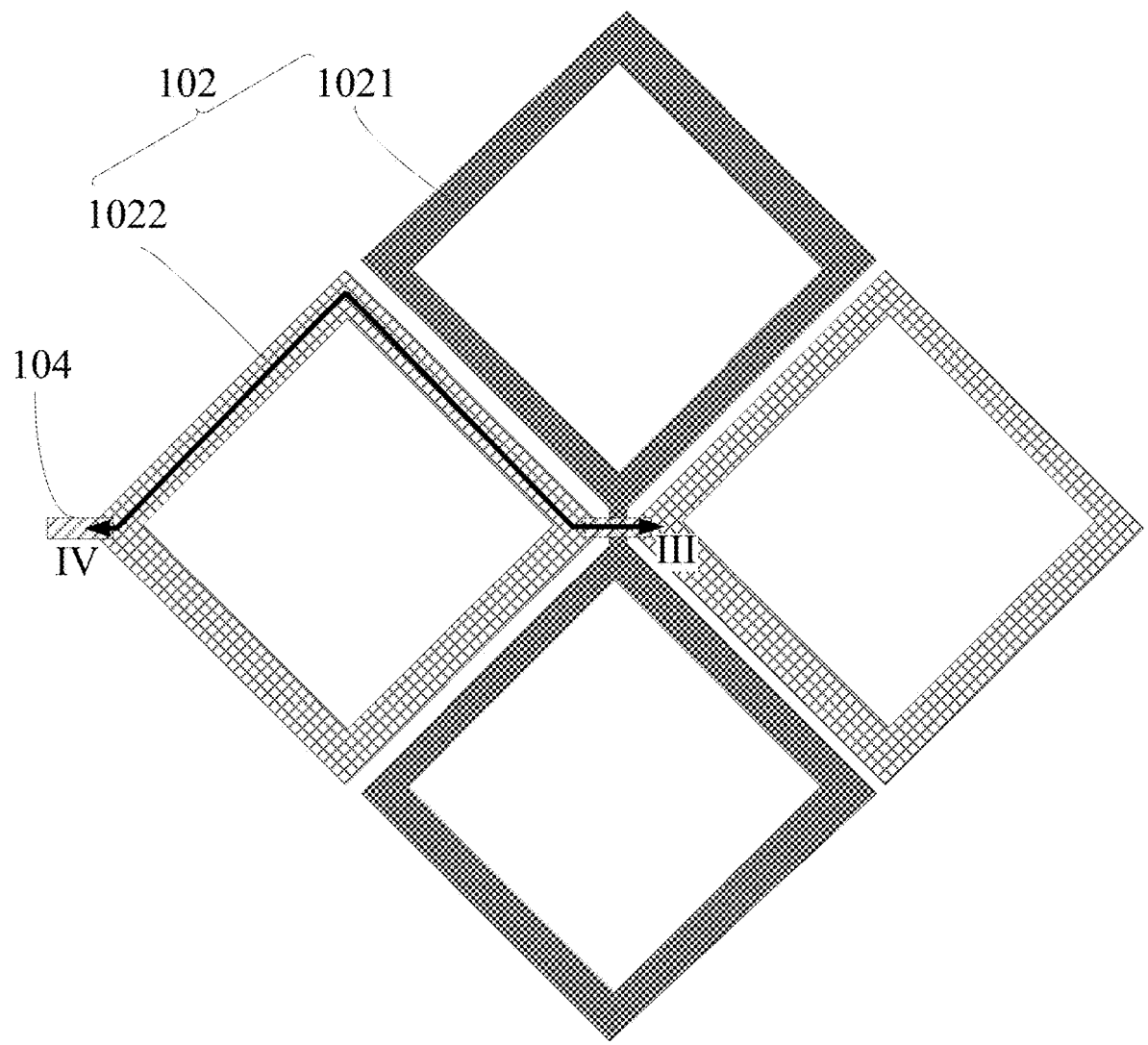
Figure 17:
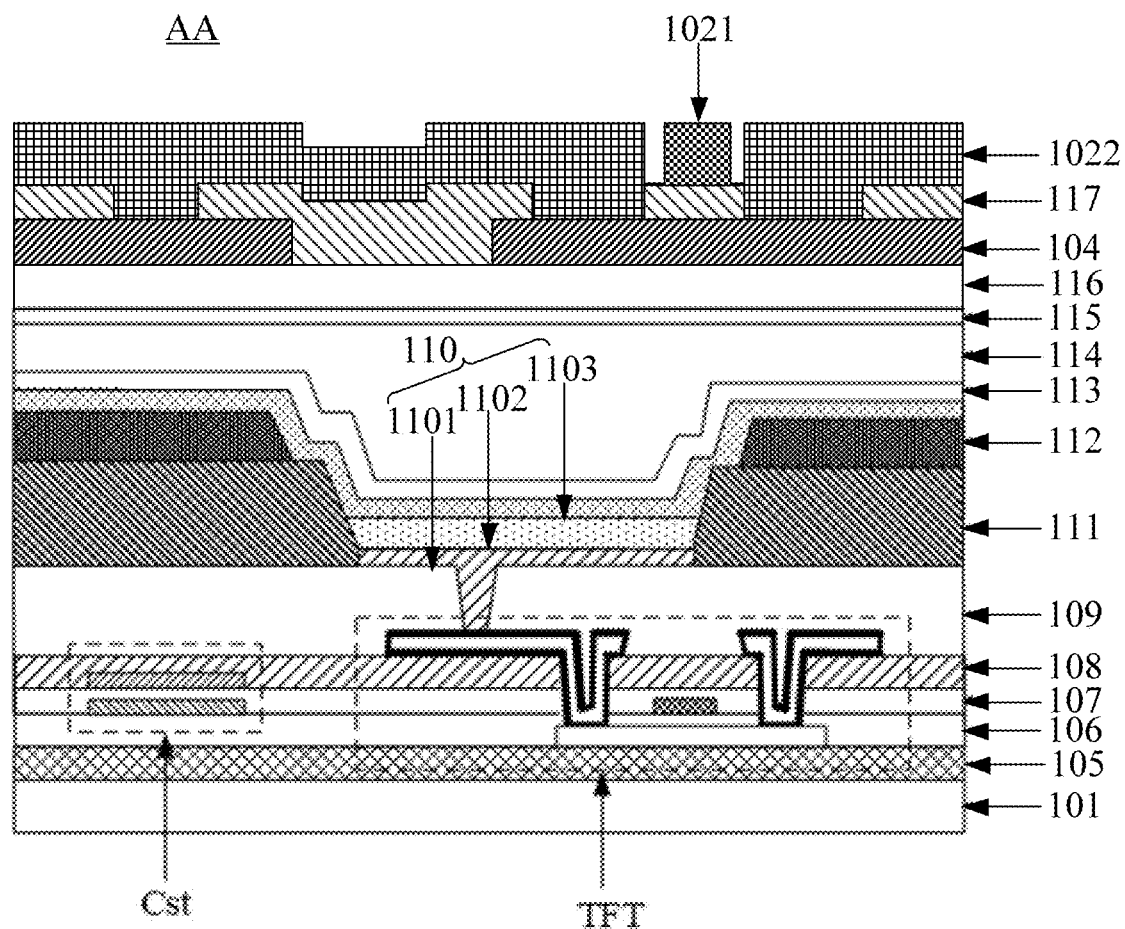

Step 5: as shown in FIG. 16 and FIG. 17, a titanium metal film, an aluminum metal film and a titanium metal film are sequentially formed on the insulating layer 117. The stacked titanium metal film, aluminum metal film and titanium metal film are patterned to form a first touch electrode 1021 and a second touch electrode 1022 in the display area AA as well as a first touch signal line $T_{x1}$, a second touch signal line $T_{x2}$, a third touch signal line $R_x$, a first shielding line $G_1$, a second shielding line $G_2$, a third shielding line $G_3$, a fourth shielding line $G_4$ and a fifth shielding line $G_5$ in the frame area BB. The first touch electrode 1021, the second touch electrode 1022 and the above-mentioned signal lines together constitute a layer TMB where the touch electrodes 102 are located. Here, each signal line in the layer TMB where the touch electrodes 102 are located is electrically connected to the corresponding signal line in the bridge layer TMA through a via hole penetrating the insulating layer 117. One first touch signal line $T_{x1}$ and one second touch signal line $T_{x2}$ closest to the first shielding line $G_1$ are disconnected in the layer TMB where the touch electrodes 102 are located. FIG. 17 is a schematic diagram of a cross-sectional structure along the line I-II in FIG. 16.

Figure 18:
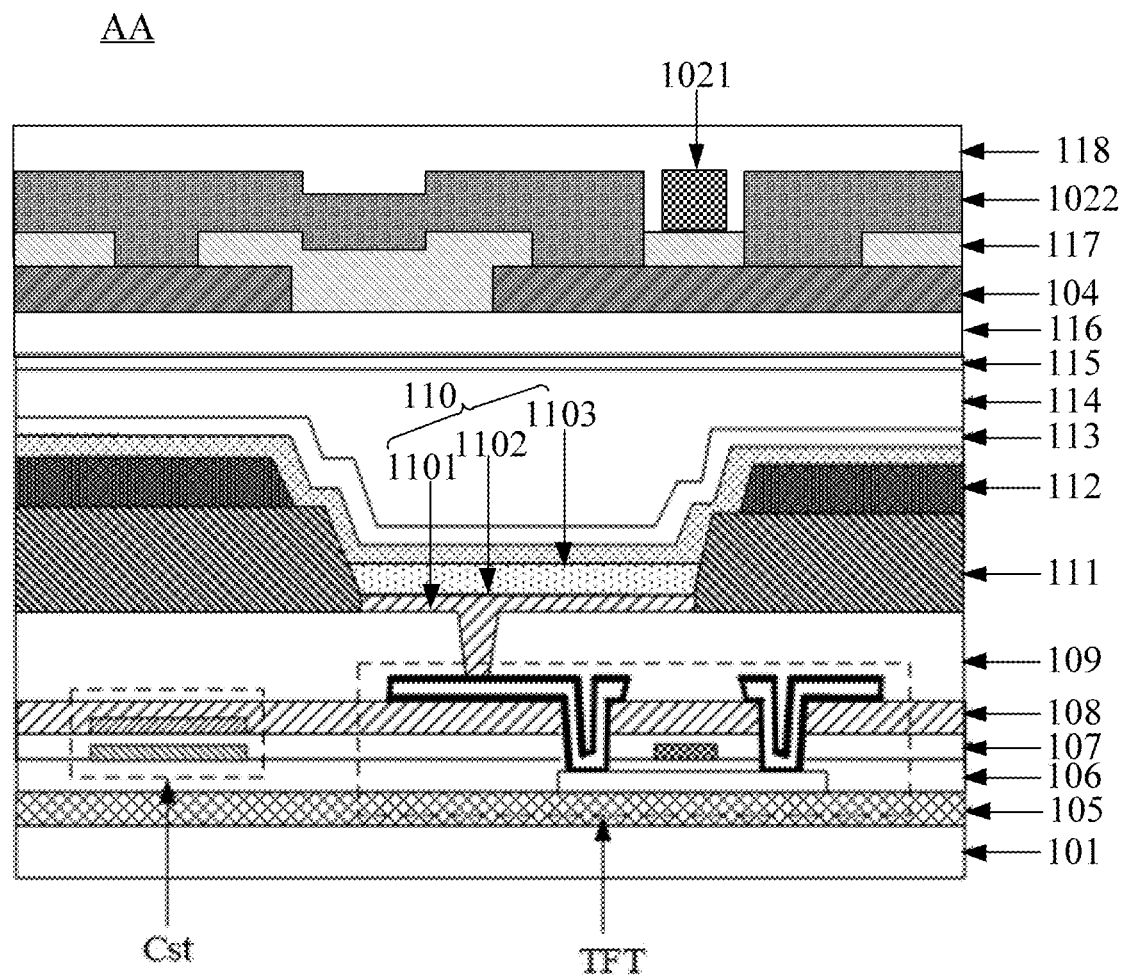

Step 6: as shown in FIG. 18, a protection layer 118 is formed on the layer TMB where the touch electrodes 102 are located. The material of the protection layer 118 may be polyimide (PI) and may cover the first touch electrode 1021 and the second touch electrode 1022, to achieve the function of insulation protection for the first touch electrode 1021 and the second touch electrode 1022.

Here, the above display substrate provided by the embodiments of the disclosure is formed.

Based on the same inventive concept, the disclosure further provides a display device, including the above display substrate provided by the embodiments of the disclosure. The display substrate may be an OLED display substrate. Since the principle of the display device to solve the problem is similar to the principle of the above display substrate to solve the problem, the implementations of the display device can refer to the embodiments of the above display substrate, and the repeated description thereof will be omitted.

In some embodiments, the above display device provided by the embodiments of the disclosure may be: mobile phone, tablet computer, television, display, notebook computer, digital photo frame, navigator, smart watch, fitness wristband, personal digital assistant, and any other product or component with display function. The display device provided by the embodiments of the disclosure may also include but not limited to: a radio frequency unit, a network module, an audio output unit, an input unit, a sensor, a display unit, a user input unit, an interface unit, a memory, a processor, and a power supply, etc. Those skilled in the art can understand that the composition of the above display device does not constitute a limitation on the display device, and the display device may include more or fewer components than the above components, or combine some components, or use different component arrangements.

Although the preferred embodiments of the disclosure have been described, those skilled in the art can make additional alterations and modifications to these embodiments once they learn about the basic creative concepts. Thus, the attached claims are intended to be interpreted to include the preferred embodiments as well as all the alterations and modifications falling within the scope of the disclosure.

Evidently, those skilled in the art can make various modifications and variations to the embodiments of the disclosure without departing from the spirit and scope of the embodiments of the disclosure. Thus, the disclosure is also intended to encompass these modifications and variations to the embodiments of the disclosure as long as these modifications and variations come into the scope of the claims of the disclosure and their equivalents.

What is claimed is:

1. A display substrate, comprising:
   a base substrate, comprising:
      a display area; and
      a frame area around the display area;
   a plurality of touch electrodes in the display area; and
   a plurality of signal lines in the frame area;
   wherein at least some of the signal lines are electrically connected to the plurality of touch electrodes; and
   the signal lines comprise:
      a first signal line and a second signal line adjacent to each other;
      wherein the first signal line and the second signal line each comprises:
         a first-layer wiring and/or a second-layer wiring, overlapping with each other in a direction perpendicular to the base substrate and electrically connected to each other;
      a line width of the first signal line is greater than a line width of the second signal line; and
      the first-layer wiring of the second signal line is disconnected, and the first-layer wiring of the first signal line is continuous;
   wherein the display substrate further comprises:
   a bridge layer between the base substrate and a layer where the plurality of touch electrodes are located; and
   an insulating layer between the bridge layer and the layer where the plurality of touch electrodes are located;
   wherein the first-layer wiring of the signal lines is arranged in a same layer as the plurality of touch electrodes, and the second-layer wiring is arranged in a same layer as the bridge layer.

2. The display substrate according to claim 1, wherein the second-layer wiring of the first signal line is continuous in a disconnected position of the first-layer wiring.

3. The display substrate according to claim 1, wherein a ratio of the line width of the first signal line to the line width of the second signal line is greater than 1.

4. The display substrate according to claim 1, wherein the signal lines comprise:
   a plurality of touch signal lines; and
   at least one first shielding line;
   wherein the plurality of touch signal lines are electrically connected to the plurality of touch electrodes, and the at least one first shielding line is floating, loaded with a fixed potential or loaded with a same signal as the touch signal lines; and
   the second signal line is the touch signal line, and the first signal line is the first shielding line.

5. The display substrate according to claim 4, wherein:
   a position where the touch signal line is electrically connected to the corresponding touch electrode is an intersection point;
   a position where the touch signal line is disconnected is a fracture; and
   a minimum distance between a center point of the fracture and the intersection point is less than or equal to 100 μm.

6. The display substrate according to claim 5, wherein the intersection point and the fracture are located on the same touch signal line.

7. The display substrate according to claim 5, wherein the fracture is between the intersection point and an end of the first shielding line close to the intersection point.

8. The display substrate according to claim 5, wherein there are a plurality of intersection points, and the fracture is located between adjacent intersection points.

9. The display substrate according to claim 5, wherein via holes penetrating the insulating layer are respectively arranged on both sides of the fracture, and the corresponding first-layer wiring and second-layer wiring are electrically connected through the via holes.

10. The display substrate according to claim 9, wherein a length of the via hole is greater than a length of the fracture in an extending direction of the signal line.

11. The display substrate according to claim 5, wherein a ratio of a length of the fracture in an extending direction of the signal line to a width of the fracture in a direction perpendicular to the extending direction of the signal line is less than 1.

12. The display substrate according to claim 4, wherein:
   the plurality of touch electrodes comprise:
      a plurality of first touch electrodes extending in a first direction;
   the plurality of touch signal lines comprise:
      a plurality of first touch signal lines; and
      a plurality of second touch signal lines;
      wherein the plurality of first touch signal lines and the plurality of second touch signal lines are electrically connected to the plurality of first touch electrodes respectively;
   the frame area comprises:
      a first frame area,
      a second frame area,
      a third frame area, and
      a fourth frame area;
      wherein the first frame area and the second frame area are respectively located on two ends of an extending direction of the first touch electrodes, and the third frame area and the fourth frame area are respectively located on two sides of the extending direction of the first touch electrodes; and
      the plurality of first touch signal lines extend from the first frame area through the third frame area to the second frame area; and the plurality of second touch signal lines are located in the second frame area;
   the at least one first shielding line is located between the plurality of first touch signal lines and the display area, and the first shielding line is arranged around the plurality of first touch signal lines;
   at least one of the at least one first shielding line, the first touch signal line with a smallest distance from the first shielding line, or the second touch signal line with a smallest distance from the first shielding line is disconnected in the layer where the plurality of touch electrodes are located, and each of the signal lines in the bridge layer is continuous.

13. The display substrate according to claim 12, wherein the second touch signal line with the smallest distance from the at least one first shielding line is disconnected in the layer where the plurality of touch electrodes are located.

14. The display substrate according to claim 13, wherein each of the second touch signal lines comprises:
   a plurality of first parts; and
   a plurality of second parts;
   wherein an extending direction of the first part intersects with an extending direction of the first shielding line, an extending direction of the second part is approximately parallel to the extending direction of the first shielding line, and each of the first parts is connected between two of the second parts; and
   the second part with a smallest distance from the display area in the second touch signal line with the smallest distance from the at least one first shielding line is disconnected in the layer where the plurality of touch electrodes are located.

15. The display substrate according to claim 14, wherein a resistance value of each of the first touch signal lines is approximately identical to a resistance value of each of the second touch signal lines.

16. The display substrate according to claim 4, wherein a ratio of a line width of the first shielding line to a line width of the touch signal line is greater than or equal to 3.

17. The display substrate according to claim 12, wherein:
the bridge layer further comprises:
  a plurality of bridge electrodes;
the plurality of touch electrodes further comprise:
  a plurality of second touch electrodes extending in a second direction;
  wherein each of the second touch electrodes comprises:
    a plurality of mutually independent touch parts;
    wherein the adjacent touch parts are connected through the bridge electrodes;
the plurality of touch signal lines further comprise:
  a plurality of third touch signal lines electrically connected to the plurality of second touch electrodes;
  wherein the plurality of third touch signal lines extend from the fourth frame area to the second frame area.

18. The display substrate according to claim 17, wherein:
the first touch electrodes are touch drive electrodes, and the first touch signal lines and the second touch signal lines are touch drive signal lines; the second touch electrodes are touch sense electrodes, and the third touch signal lines are touch sense signal lines; or the first touch electrodes are touch sense electrodes, and the first touch signal lines and the second touch signal lines are touch sense signal lines; the second touch electrodes are touch drive electrodes, and the third touch signal lines are touch drive signal lines.

19. The display substrate according to claim 17, wherein the signal lines further comprise:
  at least one second shielding line,
  at least one third shielding line,
  at least one fourth shielding line, and
  at least one fifth shielding line;
  wherein the at least one second shielding line is disposed around the plurality of third touch signal lines, and is located on a side of the plurality of third touch signal lines adjacent to the plurality of second touch signal lines;
  the at least one third shielding line is disposed around the plurality of third touch signal lines, and is located on a side of the plurality of third touch signal lines away from the display area;
  the at least one fourth shielding line is disposed around the plurality of second touch signal lines, and is located on a side of the plurality of second touch signal lines away from the plurality of first touch signal lines; and
  the at least one fifth shielding line is disposed around the plurality of first touch signal lines, and is located on a side of the plurality of first touch signal lines away from the display area.

20. A display device, comprising the display substrate according to claim 1.

* * * * *